United States Patent
Kanamaru et al.

(10) Patent No.: US 6,828,810 B2
(45) Date of Patent: Dec. 7, 2004

(54) SEMICONDUCTOR DEVICE TESTING APPARATUS AND METHOD FOR MANUFACTURING THE SAME

(75) Inventors: Masatoshi Kanamaru, Miho-mura (JP); Yoshishige Endo, Tsuohiura (JP); Takanori Aono, Chiyoda-machi (JP); Ryuji Kohno, Chiyoda-machi (JP); Hiroya Shimizu, Ryugasaki (JP); Naoto Ban, Sagamihara (JP); Hideyuki Aoki, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/207,145

(22) Filed: Jul. 30, 2002

(65) Prior Publication Data

US 2003/0122550 A1 Jul. 3, 2003

Related U.S. Application Data

(63) Continuation-in-part of application No. 09/964,708, filed on Sep. 28, 2001, now Pat. No. 6,696,849.

(30) Foreign Application Priority Data

Oct. 3, 2000 (JP) ........................................ 2000-304099
Aug. 2, 2001 (JP) ........................................ 2001-234791

(51) Int. Cl.$^7$ .......................... G01R 31/02; G01R 1/073
(52) U.S. Cl. ...................................... 324/754; 324/758
(58) Field of Search ................................ 324/754, 755, 324/758, 765, 158.1; 438/14, 17

(56) References Cited

U.S. PATENT DOCUMENTS 5,497,079 A * 3/1996 Yamada et al. .......... 324/158.1
5,781,021 A * 7/1998 Ilani ........................... 324/754
5,929,651 A * 7/1999 Leas et al. .................. 324/765
6,275,051 B1 * 8/2001 Bachelder et al. .......... 324/754

FOREIGN PATENT DOCUMENTS

JP    09-148389    6/1997
JP    11-097494    4/1999

OTHER PUBLICATIONS

Equipment Solution, Nikkei Microdevices, Jan. 2000, pp. 148–153.

* cited by examiner

*Primary Examiner*—Ernest Karlsen
(74) *Attorney, Agent, or Firm*—Antonelli, Terry, Stout & Kraus, LLP

(57) ABSTRACT

A semiconductor device testing apparatus is realized, which allows contactors to be positioned throughout the wafer surface highly accurately for uniform contact, testing a large-sized wafer, and cost reduction. A plurality of divided contactor blocks is formed with a positioning groove. The groove is used to position the plurality of contactor blocks with a positioning frame. Because the contactor blocks are divided into plurals, it is less likely that a partial surface distortion affects other portions to impair surface flatness as compared with the case where a plurality of non-divided contactors is formed integrally, and the plurality of contactor blocks can be brought into contact with a wafer to be tested uniformly. Additionally, even though abnormality is generated in a part of the contactor blocks, only the part of the contactor blocks is replaced. Therefore, replacement costs can be reduced as compared with the case where a plurality of non-divided contactors is formed integrally.

13 Claims, 8 Drawing Sheets

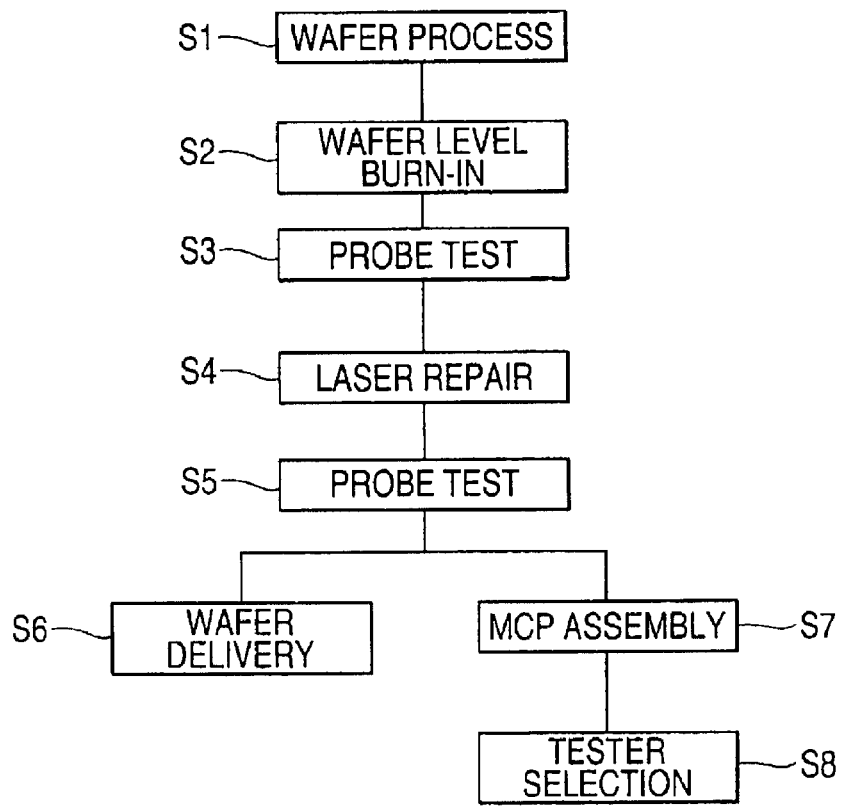
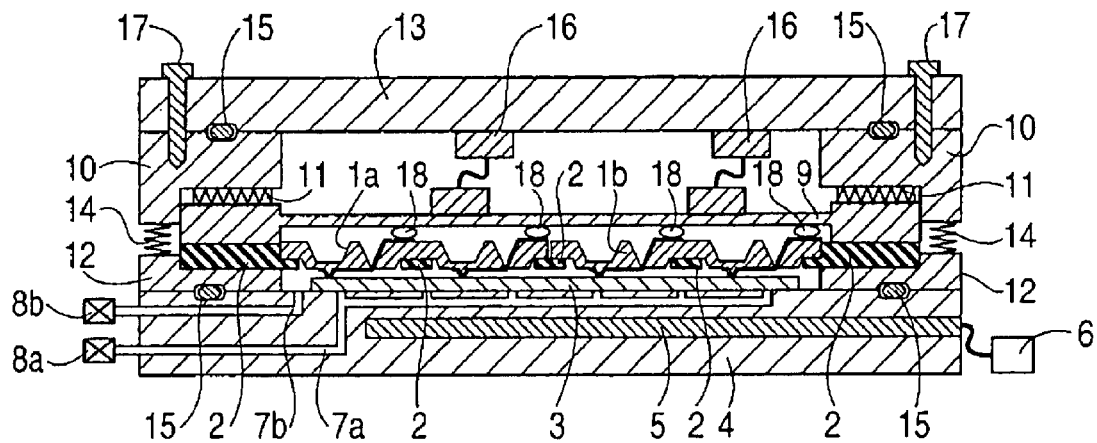

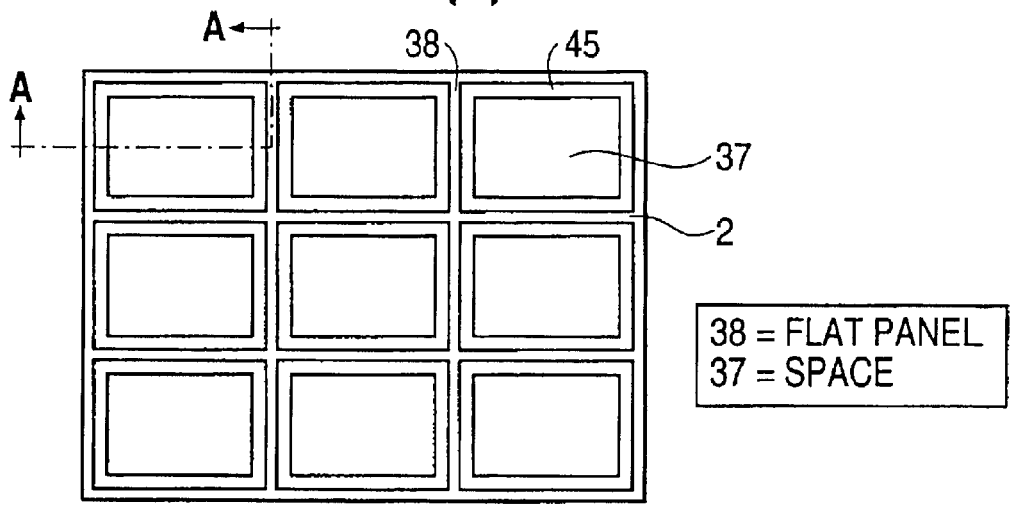
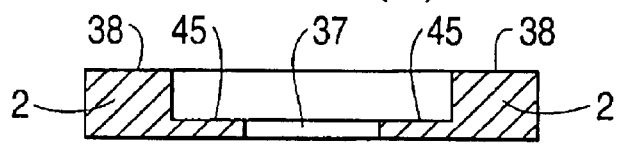
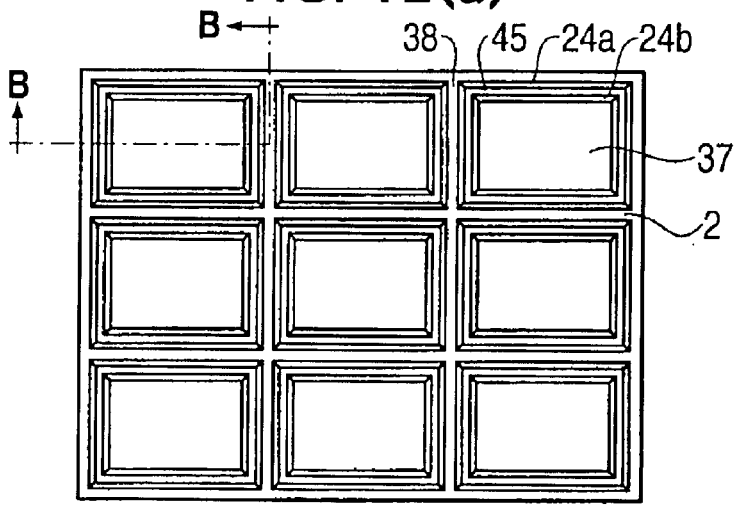
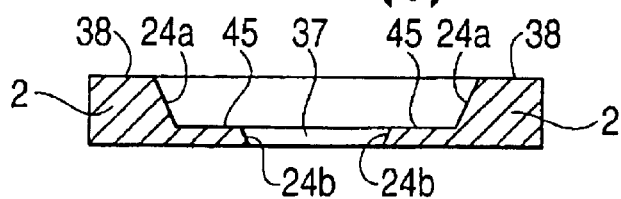

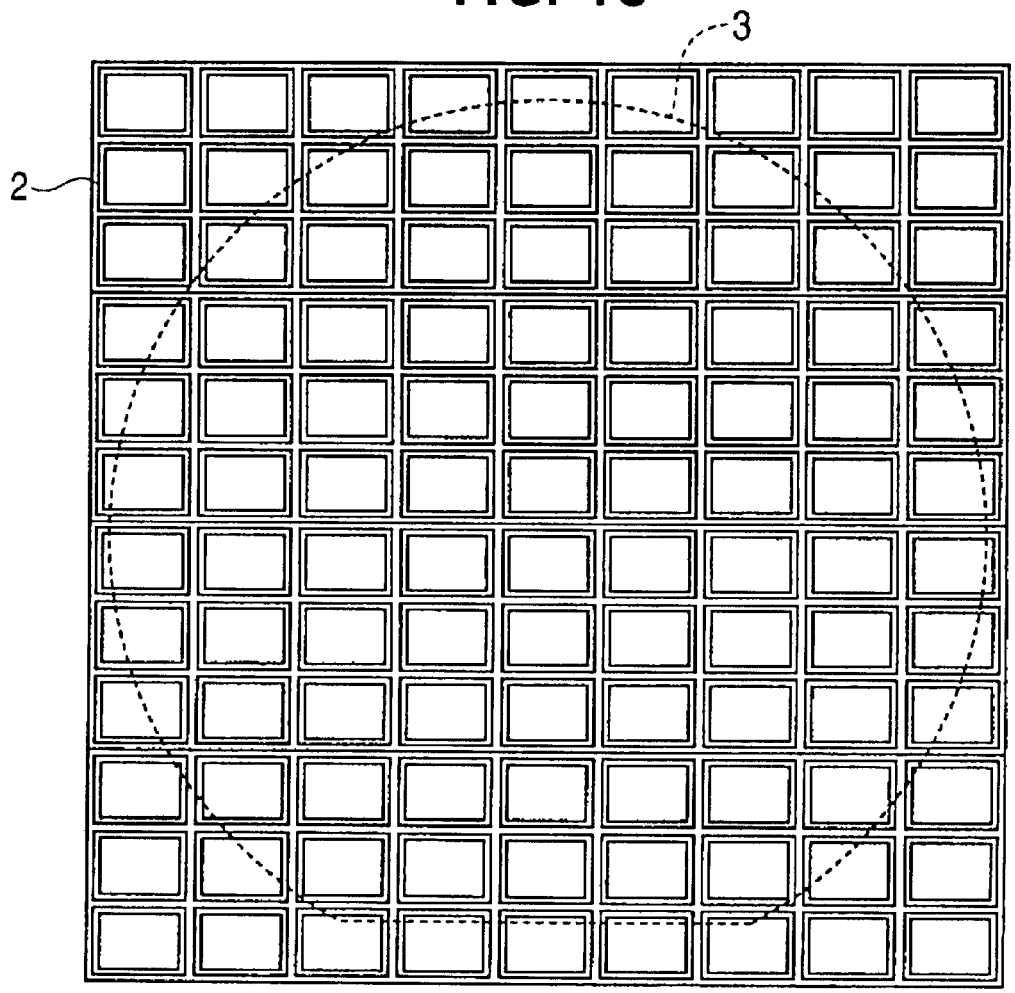

SEMICONDUCTOR DEVICE TESTING APPARATUS AND METHOD FOR MANUFACTURING THE SAME

This is a continuation-in-part (CIP) of application Ser. No. 09/964,708, filed Sep. 28, 2001, now U.S. Pat. No. 6,696,849, the entire disclosure of which is hereby incorporated by reference.

BACKGROUND OF THE INVENTION

The present invention relates to a semiconductor device testing apparatus applicable to the burn-in test and the probe test, particularly suitable for the burn-in test in the wafer condition, so-called wafer level burn-in, and a method for manufacturing the same.

According to the inventors' investigation regarding the techniques of the burn-in test in the tests and fabrication techniques of semiconductor integrated circuit devices, such techniques described in Japanese Patent Laid-Open Nos. 97494/1999 and 148389/1997, and "NIKKEI MICRO-DEVICE, January 2000", pp. 148 to 153 are named.

Japanese Patent Laid-Open No. 97494/1999 discloses a technique that a pressing member is divided to equalize pressing in order to apply pressing load to a plurality of places in the surface of the pressing member, the surface is the opposite side of the surface facing to a wafer, when a plurality of probes formed in a membrane sheet is pressed onto the wafer with the pressing member in the burn-in test process.

Additionally, Japanese Patent Laid-Open No. 148389/1997 discloses a technique that a beam having vertical elasticity is formed of a silicon substrate by the micromachining technique and a micro-contact pin is formed on the tip end of the beam having conductive thin films deposited thereon so that the micro-contact pin faces and aligns with an electrode on a wafer.

Furthermore, "NIKKEI MICRO-DEVICE, January 2000", describes a system using a TPS (Three Parts Structure) probe comprised of three components, a multilayer interconnection board, a thin film sheet with bumps and an anisotropic conductive rubber, and a system comprised of a multilayer interconnection board and a probe terminal having a structure of penetrating a copper post into a resin sheet in which the copper post is crushed to absorb height variations in electrodes when pressed.

SUMMARY OF THE INVENTION

In the meantime, as a result of investigating the techniques on the traditional burn-in test by the inventors, the following was revealed.

For example, as the test techniques of semiconductor integrated circuit devices, there are the burn-in test in which temperature and voltage stresses are applied in a high temperature atmosphere to screen chips likely to be defectives in future, and the probe test in which function tests to confirm whether a device operates as a predetermined function or DC and AC operating characteristics tests are performed to determine good/no-good products.

In recent years, in the burn-in test for semiconductor integrated circuit devices, the wafer-level burn-in technique of performing the burn-in test in a wafer condition has been used because of demands for a response to wafer shipment (quality differentiation), a response to KGD (Known Good Die) (yield improvements of MCP (Multi-Chip Package)), repair for defectives in the burn-in test, feedback of burn-in test defective data and reduction in total costs.

In this wafer level burn-in technique, a pressing mechanism for uniformly pressing the entire wafer surface, a wafer heating and temperature control mechanism, and ten thousands or more of probes throughout the wafer surface are needed.

Additionally, in the wafer level burn-in technique, warpage or waviness of a wafer and height variations in probes need to be absorbed, and thermal expansion at high temperatures also needs to be followed.

In the wafer level burn-in technique, required are routing many wires, focusing input signals, probe alignment throughout the wafer surface, separation of defective chips and breaking overcurrent, and contact check throughput the wafer surface.

On this account, in the wafer level burn-in technique, a problem has been arisen that test costs are increased because of a number of components required and a number of items to be adjusted.

Then, a technique for solving the problem regarding the burn-in test is the technique described in "NIKKEI MICRO-DEVICE January 2000", for example.

However, the system using the TPS probe described in the reference needs a coating unit for eliminating defective chips and can implement wafer level burn-in only after the probe test or laser repair. Additionally, the thin film sheet with bumps has problems that it tends to increase contact resistance with the number of contact increased and is a one-piece product impossible in partial repair, and the anisotropic conductive rubber has a shorter lifetime.

Furthermore, the system using the multilayer interconnection board and the probe terminal, described in "NIKKEI MICRO-DEVICE January 2000", the system has problems that the resin sheet is exclusive for a gold pad and disposable at every time.

For example, in the burn-in test or probe test, particularly in the wafer level burn-in test, the purpose of the invention is to realize a semiconductor device testing apparatus and a method for manufacturing the same, in which a divided contactor integration system is adapted, the divided contactors are positioned throughout the wafer surface highly accurately for uniform contact, whereby tests for a large-sized wafer is allowed to intend cost reduction.

To achieve the purpose described above, the invention is configured as follows:

(1) In a semiconductor device testing apparatus comprising a contactor substrate having a probe for electrically contacting a plurality of electrode pads in a semiconductor device, the contactor substrate has a plurality of contactor blocks, each of the contactor blocks is formed with the probe formed in a beam, wiring and a positioning notch part, and a positioning frame for positioning the plurality of contactor blocks is disposed, the positioning frame is formed with a supporting part for supporting the positioning notch part formed in the contactor block.

(2) Preferably, in item (1), the positioning notch part formed in the contactor block is a positioning groove formed in the contactor block, and the positioning groove is formed in a probe forming surface of the contactor block.

(3) Also preferably in item (2), the positioning groove in the contactor block is two groves almost orthogonal each other.

(4) Furthermore, in items (1), (2) and (3), the contactor blockpreferably has silicon in the material thereof.

(5) Moreover, in items (1), (2), (3) and (4), the positioning frame has 42 alloy, nickel alloy, glass, or silicon in the material thereof.

(6) In a contactor substrate for use in a semiconductor device testing apparatus, which has a probe for electrically contacting a plurality of electrode pads in a semiconductor device, the contactor substrate has a plurality of contactor blocks, each of the contactor blocks is formed with the probe formed in a beam, wiring and a positioning notch part, in which a positioning frame for positioning the plurality of contactor blocks performs positioning, the positioning frame is formed with a supporting part for supporting the positioning notch part formed in the contactor block.

(7) In a method for manufacturing a semiconductor device testing apparatus in which a contactor substrate has a probe for electrically contacting a plurality of electrode pads, the contactor substrate has a plurality of contactor blocks wherein each of the contactor blocks is formed with the probe formed in a beam, wiring and a positioning notch part, the method comprising the steps of: depositing a thermally-oxidized film over a substrate surface to form a mask pattern for forming the probe; forming the probe according to etching processing; forming a multilayer mask; processing holes having a different depth by etching to process the beam, a through hole, and a positioning step part; and depositing a metal thin film on both sides for patterning to form a wiring layer, whereby the contactor block is formed.

According to the semiconductor device testing apparatus of the invention, the contactor substrate can be positioned in the X- and Y-directions and also the Z-direction of the height direction. Furthermore, an amount of relative shift in alignment caused by the difference of a linear expansion coefficient due to temperature rise becomes greater in the peripheral part as compared with a system of positioning the contactor substrate at end faces. However, positioning can be done in the center part of the divided contactors in the invention. Thus, it is hardly subject to the influence of the amount of relative shift in alignment caused by the difference of a linear expansion coefficient due to temperature rise in the positioning frame. In other words, the influence of shift in alignment between probes and electrode pads formed on a wafer to be tested is significantly small in a large-sized wafer to be tested as well.

A plurality of divided contactor blocks is independent of the size of a wafer to be tested. Therefore, traditional facilities can be utilized for wafers increasing in size. Accordingly, fabrication costs of the contactor substrate according to a wafer full surface simultaneous contact system can be reduced.

Moreover, positioning in the X-, Y- and Z-directions is allowed as well, and thus the contactor substrate is allowed to follow warpage or waviness of the wafer to be tested independently.

Besides, the wafer to be tested and the contactor blocks are expanded similarly under temperature conditions during the burn-in test. Therefore, the alignment accuracy of the probes can be obtained sufficiently throughout the wafer surface.

BRIEF DESCRIPTION OF THE DRAWINGS

The teachings of the invention can be readily understood by considering the following detailed description in conjunction with the accompanying drawings, in which:

FIG. 1 depicts a flowchart illustrating a method for fabricating a semiconductor integrated circuit device tested by a semiconductor device testing apparatus as one embodiment of the invention;

FIG. 2 depicts a configurational diagram illustrating a wafer level burn-in cassette of the semiconductor device testing apparatus using a vacuum reduced pressure system as one embodiment of the invention;

FIGS. 11A and 11B depict illustrations showing one example of the positioning frame in one embodiment of the invention;

FIGS. 12A and 12B depict illustrations showing another example of the positioning frame in one embodiment of the invention; and FIG. 13 depicts a diagram illustrating positional relationship between the positioning frame and a wafer.

DESCRIPTION OF THE PREFERRED EMBODIMENT

Figure 3A:
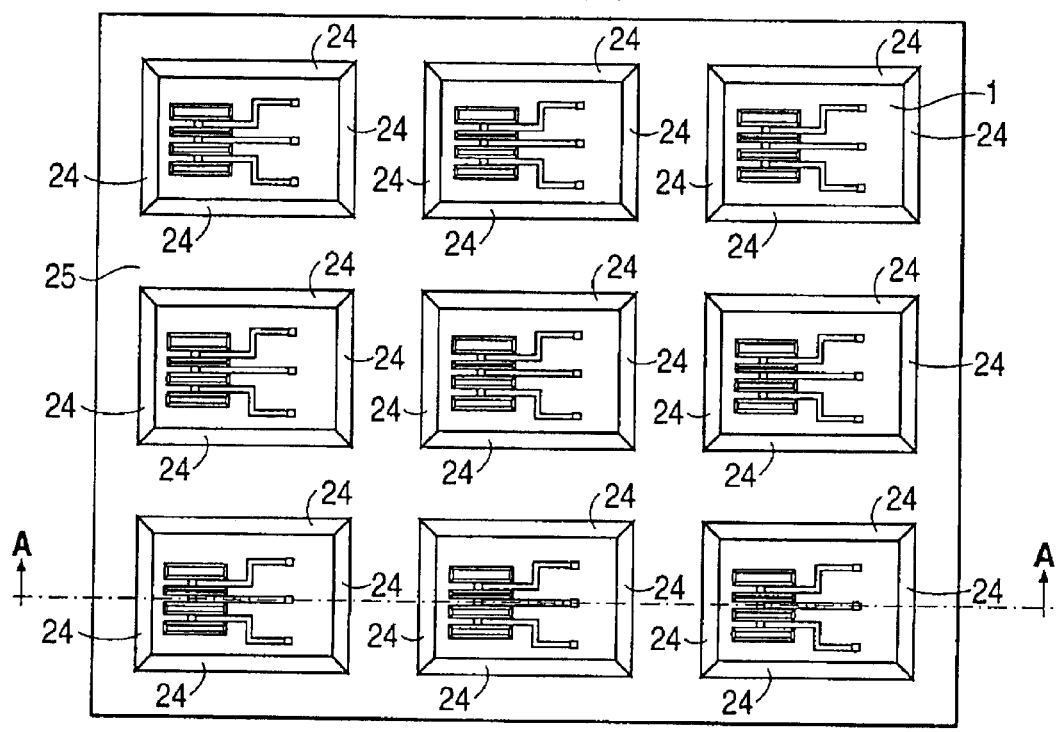
FIGS. 3A and 3B depict schematic diagrams illustrating a contactor block in one embodiment of the invention.

Hereafter, embodiments of the invention will be described with reference to the accompanying drawings.

FIG. 1 depicts a flowchart illustrating a method for fabricating a semiconductor integrated circuit device tested by the testing apparatus as the one embodiment of the invention. Additionally, an SRAM is exemplified as the semiconductor integrated circuit device in this example, but the invention can be applied to DRAMs, memory LSIs such as flash memory, or logic LSIs not only the SRAM.

(1) In a wafer process (step S1), many devices are formed on a semiconductor wafer. More specifically, in the wafer process, desired integrated circuits are formed in which the semiconductor wafer comprised of a silicon substrate, for example, repeatedly undergoes each wafer processing such as oxidation, diffusion, impurity introduction, wiring pattern formation, insulating layer formation, and interconnection layer formation, according to the specification of the SRAM.

(2) Subsequently, in a wafer level burn-in test process (step S2), the semiconductor wafer formed with many devices undergoes the burn-in test (thermal load test). More specifically, in this wafer level burn-in test process, for example, rated power supply voltage or voltage exceeding it is applied to the semiconductor wafer in a high temperature atmosphere (125 to 150° C., for example) and current is carried through the semiconductor integrated circuits to apply temperature and voltage stresses for screening chips likely to be detectives in future. In the wafer level burn-in process, used is a testing apparatus according to the wafer full surface simultaneous contact system of divided contactor integration described later.

(3) Then, in a first probe test process (step S3), the semiconductor wafer formed with many devices undergoes the probe test (continuity test). More specifically, in this probe test process, for example, the semiconductor wafer is tested in memory functions using a predetermined test pattern according to write and read operations to the SRAM in a high temperature atmosphere (85 to 95° C., for example) to perform function tests to confirm whether the semiconductor integrated circuits operate as a predetermined function, open/short tests between input and output terminals, leakage current tests, DC tests such as power supply current measurements, or AC tests for testing AC timing in memory control.

In addition, the testing apparatus according to the wafer full surface simultaneous contact system of divided contactor integration, described later, can be utilized in the first probe test process and also in the second probe test process, described later.

(4) Subsequently, in a laser repair process (step S4), as a result of the probe test, laser light is irradiated onto defective devices for repair.

More specifically, in this laser repair process, the results of the probe test are analyzed to find a defective bit of the SRAM and a fuse of redundant repair bit corresponding to this defective bit is cut with laser light to apply redundant repair processing for repair.

(5) Then, in a second probe test process (step S5), the semiconductor wafer again undergoes the probe test (continuity test) after laser repair at step S4.

More specifically, in this probe test process, the same tests are performed as those in the first probe test process to confirm that the defective bit has been replaced by the redundant repair bit according to redundant repair processing.

(6) In a wafer delivery process (step S6) subsequent to step S5, as a result of the probe test after laser repair, a non-defective semiconductor wafer is directly shipped as a product.

More specifically, in this wafer delivery process, a semiconductor wafer mounted with a plurality of SRAM chips is provided for users in this semiconductor wafer condition.

(7) In an MCP assembly process (step S7) subsequent to step S5, a non-defective semiconductor wafer is diced to separate into discrete chips and the separated chips are assembled to form a package structure.

That is, in this MCP assembly process, SRAM chips fabricated through each of steps S1 to S5 are packaged and assembled with flash memory chips, for example, similarly fabricated from the wafer process through the dicing process, as MCP.

Specifically, performed are the die bonding process for mounting the SRAM chip and the flash memory chip on a substrate, the wire bonding process for electrically connecting pads of each chip to pads on the substrate, the resin molding process for molding with resin to protect each chip and wires, and the lead forming process for forming and surface-treating external leads. Furthermore, another bonding process such as the flip chip bonding process is also possible, not limited to the wire bonding process.

(8) In a tester selection process (step S8) subsequent to step S7, a tester sorts the assembled MCPs.

More specifically, in this tester selection process, the same tests as those in the probe test of the semiconductor wafer are performed, non-defectives and defectives are selected among the MCPs, and only non-defective MCPs are shipped as a product and provided for users.

Next, one example of a semiconductor device testing apparatus as one embodiment of the invention will be described with reference to FIGS. 2 to 5, the apparatus performs the burn-in test in the wafer level burn-in process described above.

Figure 3B:
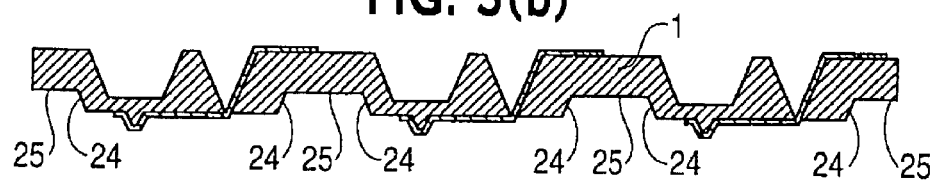
Figure 4A:
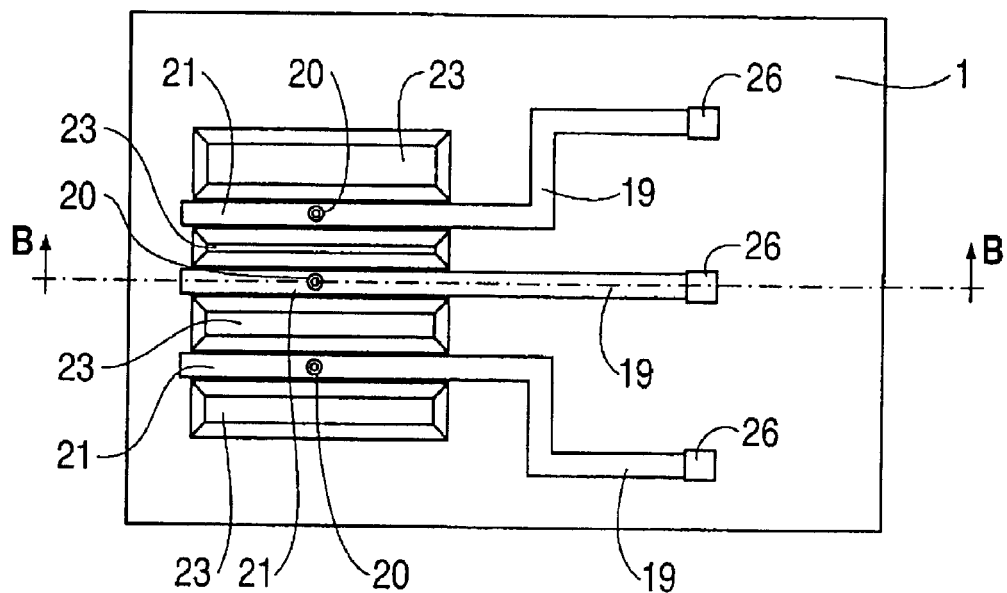
FIGS. 4A to 4C depict illustrations of main parts of the contactor block in one embodiment of the invention.
Figure 4B:
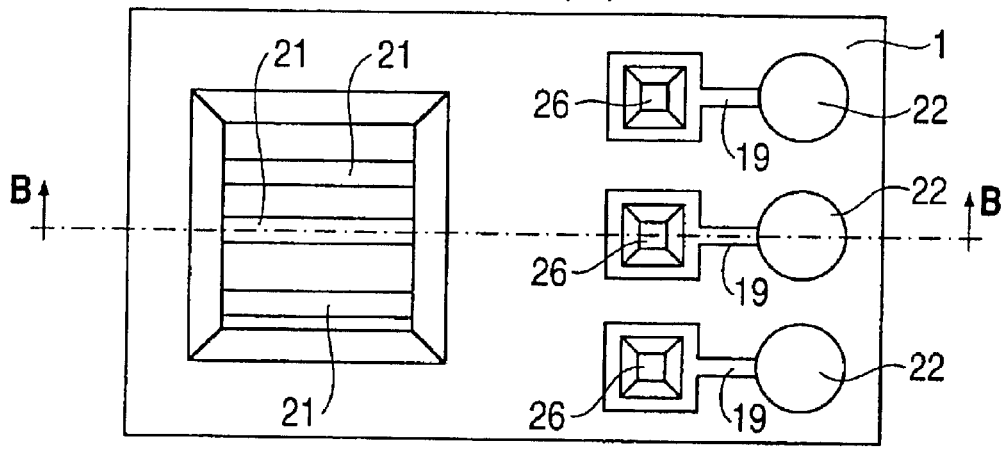
Figure 4C:
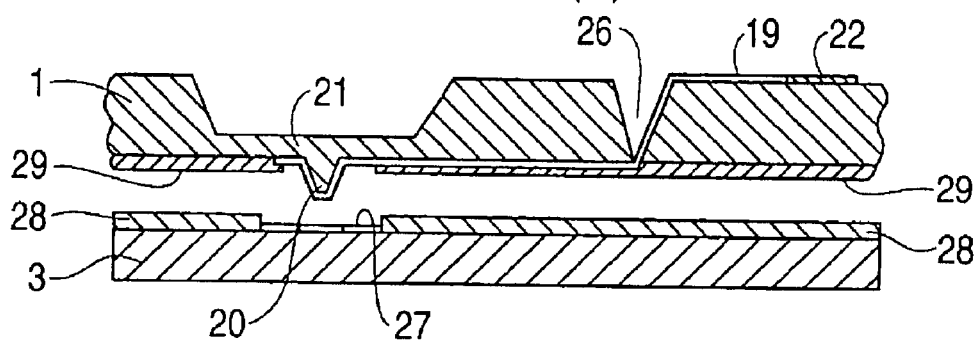
Figure 5:
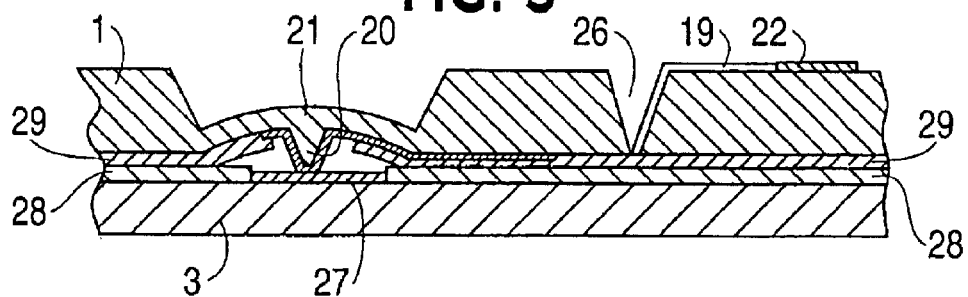
FIG. 5 depicts an operational diagram of the contactor block.

FIG. 2 depicts a schematic section of a main part illustrating a vacuum air-pressed wafer level burn-in cassette in the testing apparatus. FIG. 3A depicts a plan view illustrating a contactor block of the testing apparatus (a plurality of contactor blocks is referred to as a contactor substrate). FIG. 3B depicts a section along a line A—A shown in FIG. 3A. FIGS. 4A and 4B depict plan views illustrating a main part of the contactor block. FIG. 4C depicts a section along a line B—B shown in FIG. 4A. FIG. 5 depicts a section of FIG. 4C in a deformed state.

The vacuum air-pressed testing apparatus for the wafer level burn-in test has a cassette structure as shown in FIG. 2, for example. More specifically, in FIG. 2, the vacuum air-pressed testing apparatus has a plurality of divided contactor blocks 1 (1a, 1b and so on), a positioning frame 2 for combining the plurality of contactor blocks 1, a lower plate 12 for supporting this positioning frame 2, a multilayer board 9 placed above the contactor blocks 1, a rubber sheet 11 for adjusting heights of the multilayer board 9 during vacuum pressure reduction, an upper plate 10 placed above the rubber sheet 11, and a burn-in substrate 13 disposed above the upper plate 10.

The lower plate 12 and the upper plate 10 have a structure in which a bellows 14 maintains a vacuum condition inside the testing apparatus. Additionally, the upper plate 10 is fixed to the burn-in substrate 13 each other with bolts 17.

Furthermore, the burn-in substrate 13 is connected to a burn-in unit not shown.

In the burn-in test, tests are thus performed in which the burn-in unit feeds test control signals to the testing apparatus and signals of test results are obtained from the testing apparatus.

Moreover, the burn-in substrate 13 is disposed with an overcurrent break circuit (not shown) in which overcurrent in each chip on a wafer 3 to be tested is broken, and separation of defective chips and generation of latchup are suppressed.

The positioning frame 2 of the wafer level burn-in cassette is a member for combining the plurality of contactor blocks 1 divided each other to fix the horizontal position of the plurality of contactor blocks 1, which is formed of a material having a thermal expansion coefficient close to that of the wafer 3. That is, the positioning frame 2 is formed of 42 alloy, nickel alloy, glass, or silicon, for example. Accordingly, the testing apparatus according to the wafer full surface simultaneous contact system of divided contactor integration is realized.

In the meantime, the wafer 3 is held on a stage 4. The wafer 3 is held on the stage 4 in which the wafer 3 is vacuumed by reducing pressure through a valve 8a from a vacuum path 7a formed inside the stage 4.

The stage 4 is buried with a heater 5 having a temperature sensor built therein for partially heating the wafer 3. An electric connector 6 performs electrical control, that is, it can perform control necessary to adjust temperatures.

Pressure reduction of the testing apparatus is performed through a valve 8b from a vacuum path 7b formed inside the stage 4. In this case, an O-ring 15 is disposed between the lower plate 12 and the stage 4 for preventing vacuum leakage.

Electrically, solder balls 18 connect secondary electrode pads to the multilayer board 9 formed on the opposite side of the probe forming surface of the contactor blocks 1 contacting to the wafer 3. Connectors 16 connect the burn-in substrate 13 to the multilayer board 9.

A method for electrically connecting the secondary electrode pads to the multilayer board 9 is that silver paste, platinum paste, metal materials not molten at temperature of 150° C. or below, or composite materials of these are formed by screen printing for firing, whereby electrically connecting portions of the secondary electrode pads to the multilayer board 9 can be formed. Additionally, according to this, the secondary electrode pads and the multilayer board 9 have an easily repairable structure.

The wafer level burn-in cassette adopts the divided contactor integration system. Thus, the individual contactor blocks 1 divided can be repaired at a single block, whereby the entire contact blocks 1 do not need to be replaced, and cost reduction can be intended.

Furthermore, the contactor blocks 1 are members for contacting to a plurality of chips on the wafer 3. They are formed of silicon, for example, which is a material having the same thermal expansion coefficient as that of the wafer 3.

Moreover, the contactor blocks 1 are formed with steps (grooves 25) for easy positioning to the positioning frame 2, as shown in FIG. 3B. The steps were formed by anisotropic etching. In the positioning step part 25, a slope being an interface to the probe forming surface is a {111} plane 24.

Besides, the example shown in FIGS. 3A and 3B is an example of the contactor block 1 being divided into nine chips.

Next, the detailed structure of the contactor block 1 will be described.

FIGS. 4A to 4C depict diagrams illustrating a single contactor bock 1. The surface of the contactor block 1 is disposed with a plurality of probe parts comprised of a probe 20 and a double-ended beam 21 for supporting this probe 20 as shown in FIG. 4A, for example.

Each of the probes 20 has a projecting shape for electrically contacting a test electrode pad of each chip on the wafer 3. It is formed into a pyramid shape by micromachining techniques such as anisotropic etching.

Additionally, each of the probe 20 is formed on the double-ended beam 21, and grooves 23 are formed around the periphery. A wiring layer 19 serving as an electrically connecting portion is continuously formed from the periphery of the probe 20 through a through hole 26 to the secondary electrode pad 22 formed on the opposite side of the surface formed with the probes 20 as shown in FIG. 4B, for example.

Furthermore, an insulating film 29 is formed over the surface of the wiring layer 19 on the surface formed with the probes 20, as shown in FIG. 4C. And, a protecting film 28 comprised of polyimide is formed around an electrode pad 27 of the wafer 3.

The wiring layer 19 is formed with sputtered or plated layers of the combination of Au, Cu, Ni, Rh, Pd and Ti, for example. In addition, the wiring layer 19 has a thicker wiring width in wiring patterns of power supply and ground lines than wiring patterns of signal lines. Furthermore, the projecting part of the probe 20 has a thinner plating thickness and the other parts have a thicker plating thickness than that for lower resistance values.

The portion of the double-ended beam 21 around the probe 20 is deformable, for example, from the state shown in FIG. 4C to the state shown in FIG. 5 by pressure reduction according to the vacuum air-pressed system. Then, in the deformed state as shown in FIG. 5, the probe 20 is uniformly brought into contact with the test electrode pad 27 of each chip on the wafer 3 with a predetermined pressure.

Moreover, in the embodiment of the invention, a pressing force necessary to the electric continuity of the probe 20 to the electrode pad 27 was about 6 g.

When the wafer level burn-in test is performed by using the vacuum air-pressed testing apparatus as described above, the wafer level burn-in cassette is assembled, and then the inside of the apparatus is vacuumed for pressure reduction, whereby each of the probes 20 in the contactor blocks 1 combined in the positioning frame 2 is uniformly brought into contact with the test electrode pad of each chip on the wafer 3 with a predetermined pressure.

Subsequently, the burn-in unit feeds test control signals for the wafer level burn-in test to each chip on the wafer 3 through the burn-in substrate 13 and the multilayer board 9. The burn-in unit obtains the signals of the test result from each chip on the wafer 3 through the multilayer board 9 and the burn-in substrate 13, whereby chips likely to be defectives in future can be screened.

In the burn-in test, the wafer 3 and the contactor blocks 1 are fixed by vacuuming so as to flatten warpage or waviness inside the wafer level burn-in cassette even though the wafer 3 has warpage or waviness. Then, the wafer 3 and the contactor blocks 1 are thermally expanded similarly under a high temperature condition in the wafer level burn-in test. Additionally, the positioning frame 2 is also thermally expanded close to as the wafer 3. Thus, the alignment accuracy of each of the probes 20 in the contactor blocks 1 with the test electrode pad for each chip on the wafer 3 can be obtained sufficiently.

Next, the machining process of the contactor block 1 using the micromachining technique excellent in mass production will be described with reference to FIGS. 6A to 6F.

In FIGS. 6A to 6F, a silicon wafer 30 having a thickness of 500 $\mu$m and the (100) direction is first prepared. Then, a thermally oxidized film 31 having a thickness of 0.5 $\mu$m is deposited. The thermally-oxidized film 31 deposited on one surface of the silicon wafer 30 undergoes resist coating, pattern exposure, development, and etching of the thermally-oxidized film to form mask patterns for probe formation with photolithography process.

To obtain a targeted probe tip end shape, the mask pattern shape is formed with supplementary patterns for responding to corner deformation due to etching.

Figure 6A:
FIGS. 6A to 6F depict diagrams illustrating machining processes of the contactor block.
Figure 6B:
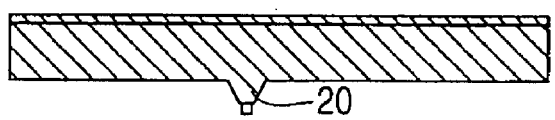

After that, a potassium hydroxide aqueous solution of a temperature of 70° C. is used to perform the anisotropic etching process in a step difference of 20 $\mu$m from one side and the probe 20 is formed as shown in FIG. 6B. At this time, the probe forming part is formed with a slope comprised of the {111} crystal plane. According to this process, a plurality of probes 20 can be formed collectively.

In addition, not only the potassium hydroxide aqueous solution, other wet etching solutions, such as ethylenediamine pyrocatechol, tetramethylammonium hydroxide, and hydrazine can also be used for the etching process of the silicon wafer 30.

Figure 6C:
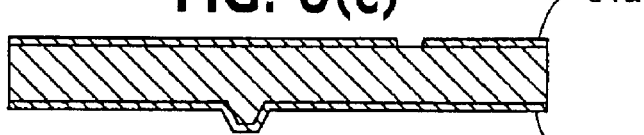
Figure 6D:
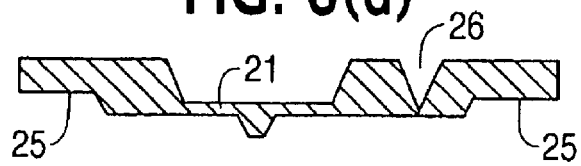

Furthermore, multilayer masking is used in order to perform the etching process to collectively form holes having a different depth in time difference. As shown in FIG. 6C, the photolithography process is used to repeat oxidation, resist coating, pattern exposure, development, etching of the thermally oxidized film and oxidation. In further detail, after forming the thermally oxidized film, shallower holes are patterned in a sequential order and a multilayer mask 31a is formed. Moreover, the contactor block having a structure shown in FIGS. 6A to 6F has four types of different holes.

subsequently, as shown in FIG. 6D, a through hole 26 of the deepest hole is patterned, and then holes having a different depth are processed by anisotropic etching. The double-ended beam 21, the through hole 26, and the positioning step part 25 are processed to complete the structural body.

In this machining process, the dry etching process may be used other than the anisotropic etching process. In addition, an ICP-RIE (Inductively Coupled Plasma-RIE) unit is used for a dry etching unit, whereby the etching process having a vertical wall with an aspect ratio of about 20 can be performed.

In the machining technique described above, the example in which the thermally oxidized film is adapted to the mask material of anisotropic etching has been described. However, a silicon nitride film and a composite film of a silicon nitride film formed over a thin thermally oxidized film may be used as the mask materials.

Figure 6E:
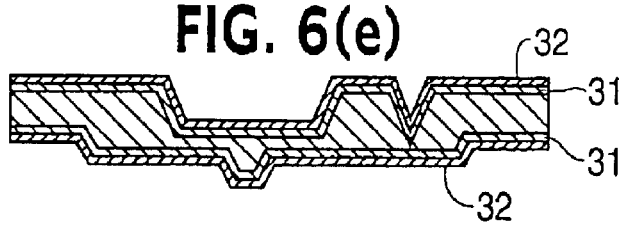

Then, in the wiring forming process, the thermally-oxidized film 31 is formed over the entire surface of the structural body, and then a metal thin film 32 is formed on both sides by a sputtering unit to pattern the metal thin film by the photolithography process using an electrodeposited resist, as shown in FIG. 6e.

Figure 6F:
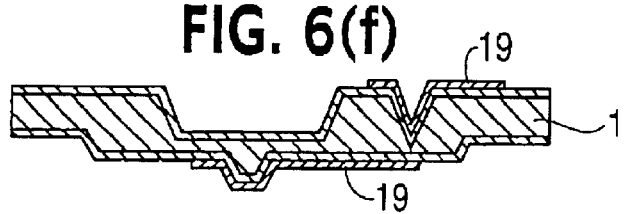

Subsequently, as shown in FIG. 6F, a plating unit is used to form the wiring layer 19 over the silicon wafer 30 with copper and nickel materials.

According to the machining process described above, the contactor block 1 is completed.

In addition, in the machining process, those in which Cr or Ti is deposited 20 nm in thickness and Au is deposited 1000 nm in thickness thereabove were used for the metal thin film with the sputtering unit. Deposition of Cr or Ti is to enhance adhesion of an underlayer to Au.

Furthermore, for the wiring material, other materials may be used as long as the materials are not molten at temperature of 150° C. or above, have electrical continuity, and are capable of forming a thin film. Moreover, for units used for wiring, units other than the sputtering unit, such as a vapor deposition unit or CVD (Chemical Vapor Deposition) unit may be used.

Besides, the wiring forming method is not limited to the lift-off method. Wiring may be formed in which a resist capable of three-dimensionally forming a resist pattern, such as the electrodeposited resist or a resist with a spray resist coating unit, is used to deposit a thin film throughout the substrate, the photolithography technique is used for etching, and then plating. Cu is deposited 10 μm in thickness thereabove and Ni is further deposited 2 μm in thickness by the plating unit for forming the multilayer wiring 19 from the probe 20 to the electrode pad.

The machining process described above is excellent in mass production, and units used in the semiconductor manufacturing techniques can be diverted. Thus, traditional facilities can also be utilized for large-sized wafers, and fabrication costs of the contactor blocks according to the wafer full surface simultaneous contact system is possible.

Next, the positioning step part formed in the contactor block 1 will be described in detail with reference to FIGS. 7 and 8A to 8C.

Figure 7:
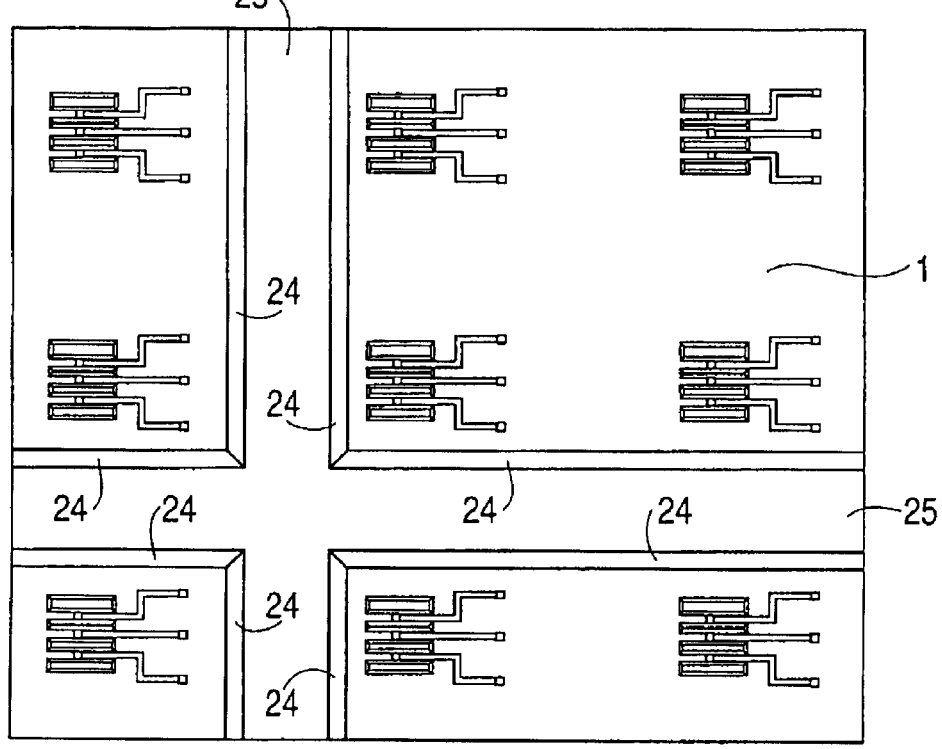
FIG. 7 depicts an illustration showing a positioning step part formed in the contactor block in one embodiment of the invention.
Figure 8A:
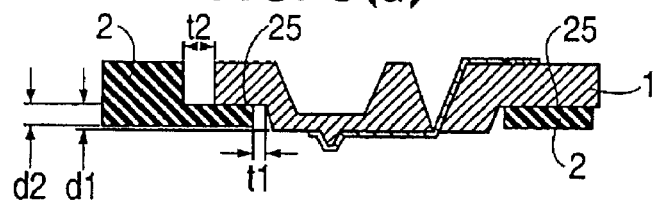
FIGS. 8A to 8C depict sections illustrating positional relationship between the contactor block and a positioning frame in one embodiment of the invention.
Figure 8B:
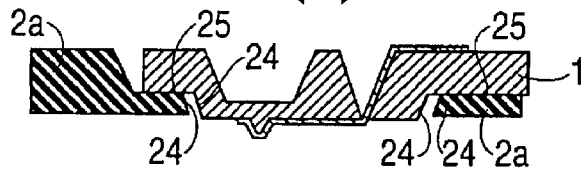
Figure 8C:
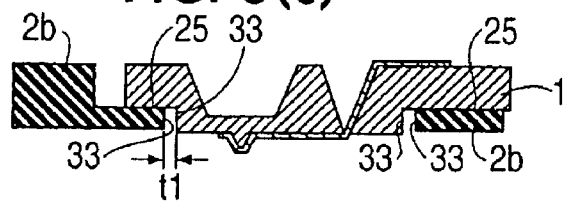

FIG. 7 depicts a plan view illustrating a contactor block different from the contactor block shown in FIG. 3. FIGS. 8A to 8C depict schematic sections illustrating positional relationship between the contactor block and the positioning frame.

As for the positioning step part 25 formed in the contactor block 1, it is considered that the entire surface other than the periphery of the probe 20 is formed into the positioning step part as shown in FIG. 3. However, to accurately positioning the X-, Y- and Z-directions in the three-dimensional directions, it can be attained by the configuration of at least two lines orthogonal each other in a single contactor block 1 as shown in FIG. 7. More specifically, one line positions the X-direction and the other line positions the Y-direction. Then, the dimension in the height direction (depth direction) of the step part 25 positions the Z-direction.

In addition, FIG. 7 is the example in which silicon was used and processed with anisotropic etching. The {111} crystal plane 24 is formed in the step part 25.

In the meantime, a problem in the burn-in test for a large-sized wafer is that the test electrode pad is shifted from the probe in alignment due to the difference in a linear expansion coefficient between the wafer to be tested and the substrate formed with the probes or a substrate holding the substrate with the probes during the test.

The influence is greater in the periphery of the large-sized wafer than in the center. This is because the wafer is expanded from the center toward the radius direction. In the embodiment of the invention, a structure is realized in which the test electrode pad is hardly shifted from the probe in alignment due to the difference in the linear expansion coefficient between the wafer to be tested and the substrate formed with the probes or the substrate holding the substrate with the probes during the test.

Hereafter, the structure will be described.

The positioning frame 2 is formed with a step comprised of an upper end face and a lower end face. As shown in FIG. 8A, a gap between a starting position of the slope 24 of the positioning step part 25 formed in the contactor block 1 and the lower end face of the positioning frame 2 is set t1, and a gap between the side face of the contactor block 1 and the upper end face of the positioning frame 2 is set t2 in the width direction.

At this time, the positional relationship between the contactor block 1 and the positioning frame 2 needs to be set t1<t2. By setting such the positional relationship, the positioning frame 2 is expanded and stretched when temperature rises during the burn-in test, and the contactor block 1 also follows it for no influence of shifting in alignment. On this account, the test electrode pad is not shifted from the probe in alignment even in the periphery of the wafer.

In addition, there is another advantage that the dimensional accuracy of cutting the contactor bock 1 out of the wafer by dicing does not need to be so precise. Furthermore, specific dimensions of each of the gaps can be set where t1 is 5 μm and t2 is 300 μm, for example.

Moreover, when depth d1 of the positioning step part 25 is compared with thickness d2 of the lower end face of the step part of the positioning frame in the height direction, it needs to be set d1>d2. This is because pressing the test electrode pad is done by bending the beam, and therefore a proper pressing force cannot be obtained when the relationship of d1<d2 is set.

Besides, the depth dimension of d1 is preferably set to a half of the thickness of the contactor block 1 or under. This is because the strength of the contactor block 1 itself drops when the depth dimension of d1 is set greater. A specific example of the dimensional difference between d1 and d2 is 30 μm.

FIG. 8B depicts a schematic section illustrating an exemplary structure of an example using silicon for the material of the positioning frame. In FIG. 8B, a positioning frame 2a can be processed by using anisotropic etching, and the slopes 24 of the {111} crystal plane can be formed in the upper and lower end faces of the positioning frame 2a. Thus, they are formed into the same shape as the slope formed in the positioning step part 25 in the contactor block 1.

Consequently, the gap t1 shown in FIG. 8A can be further reduced. Furthermore, because of the same linear expansion coefficient, an expansion coefficient due to temperature rise can be equal. Accordingly, the accuracy of positioning is enhanced.

In addition, such a structure shown in FIG. 8C can be used as well. The structure shown in FIG. 8C is that the dry etching process was used to process the positioning step part 25 in the contactor block 1 to form a vertical plane 33 instead of the slope 24. In the example of forming the vertical plane 33, when silicon is adapted to a positioning frame 2b, the dry etching process is used to the positioning frame 2b as similar to the contactor block 1, whereby the vertical plane 33 can be formed. On this account, the positioning accuracy can be enhanced. Furthermore, the ICP-RIE (Inductively Coupled Plasma-RIE) unit may be used for this process.

Moreover, according to the formation of such the structure, positioning the contactor block 1 is determined by the positioning step part 25, and thus highly accurate positioning can be performed when the contactor blocks 1 having variations in wafer thickness are combined, for example.

The contactor blocks 1 and the positioning frames (2, 2a and 2b) thus configured are adapted to the wafer level burn-in testing apparatus, whereby the burn-in test for the large-sized wafer can be performed with low costs.

Next, an exemplary configuration of the invention in the wafer level burn-in test according to the wafer full surface simultaneous contact system of divided contactor integration will be described in detail with reference to FIGS. 9 and 10.

Figure 9:
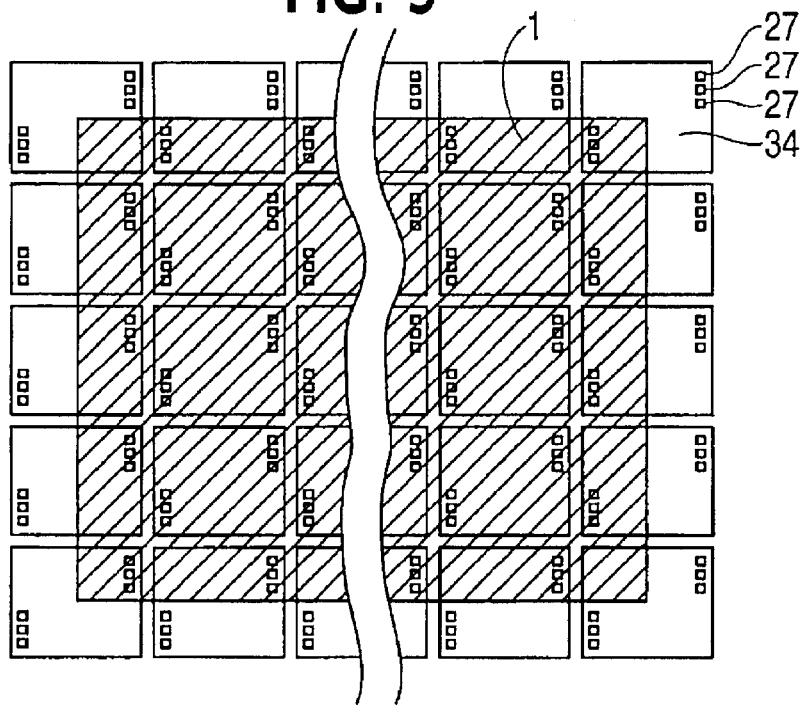
FIG. 9 depicts an illustration showing a single contactor block in the wafer level burn-in test in one embodiment of the invention.

FIG. 9 depicts an illustration showing a single contactor block 1. FIG. 10 depicts an illustration showing the relationship between the contactor block 1 and chips 34 on the wafer 3.

Each of the chips 34 on the wafer 3 has a BIST (Built-in Self Test) circuit for wafer level burn-in other than a memory circuit, for example. This BIST circuit is disposed with a register circuit, a control circuit, a counter circuit, and a decoder circuit.

Additionally, each of the contactor blocks 1 is configured such that a single contactor block 1 corresponds to a plurality of the chips on the wafer 3, as shown in FIG. 9.

Figure 10:
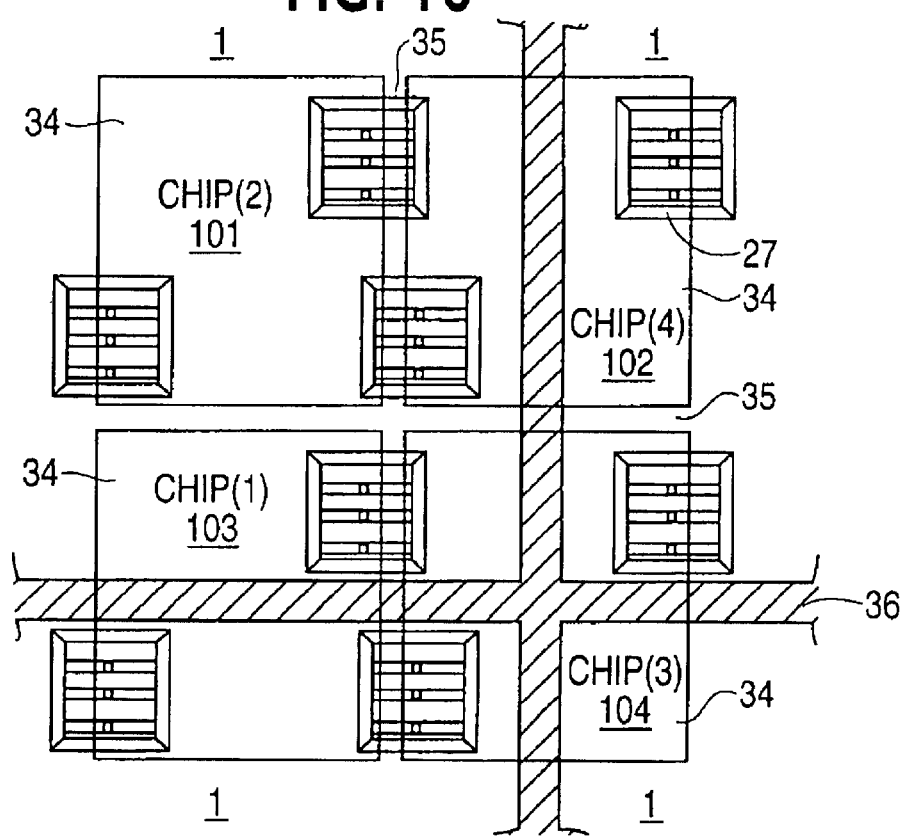
FIG. 10 depicts an illustration showing the contactor blocks and chips in the wafer level burn-in test in one embodiment of the invention.

For example, the relationship between the contactor block 1 and the chips 34 is such that a separation area 36 (indicated by slashes) is shifted from a scribe area 35 for separating each of the chips 34, as shown in FIG. 10.

More specifically, the peripheral part of the contactor block 1 is sifted from the peripheral part of the chip 34 in position. In FIG. 10, the separation area 36 between the peripheral parts of the contactor bocks 1 is located almost in the center line of the chips 34 in the orthogonal direction (vertical direction in the drawing), whereas the separation area 36 between the peripheral parts of the contactor blocks 1 is located between the test electrode pads 27 of the chips 34 in the horizontal direction (lateral direction in the drawing).

In the positional relationship between the contactor block 1 and the chips 34 described above, each of the probes 20 on a single contactor block 1 is electrically contacted to a unit of a plurality of the test electrode pads 27 on each of the chips 34. Clock signals for wafer level burn-in, test mode set signals, entry signals for wafer level burn-in, and test data are fed to each of the chips 34 as test control signals. Then, signals for determining the good/no-good are obtained as test result signals, whereby the possibility to be a defective in future can be determined at every chip.

The positioning frame 2 for the divided contactor blocks 1 can be formed large regardless of the trend in the reducing scribe area 35 on the wafer 3. That is, the divided contact system needs the positioning frame 2 for integration, but the dimensions of the positioning frame 2 can be formed widely without the limitation of the dimensions of the scribe area 35.

In addition, the scribe area 35 tends to be reduced for improving the number of chips obtained, but it can be coped with no problem. Furthermore, the size and cutting accuracy of the divided contactor blocks 1 can have a greater freedom of design despite the constraints of the scribe area 35.

FIGS. 11A and 11B depict a plan view and a section of a positioning frame 2 for positioning the contactor block 1. FIG. 11B depicts a section along a line A—A shown in FIG. 11A.

The positioning frame 2 has a different processing method depending on materials, and thus a shape of the positioning step side face of the frame is varied. The example shown in FIGS. 11A and 11B is an example that used 42 alloy having a linear expansion coefficient close to that of silicon as the material for the positioning frame 2.

In FIGS. 11A and 11B, a flat part 38 shows the topmost surface of the frame 2. A positioning step part 45 is for supporting the contactor block 1. The contactor blocks 1 are inserted into a plurality of spaces 37 for positioning.

FIGS. 12A and 12B depict a plan view and a section of a positioning frame 2. FIG. 12B depicts a section along a line B—B shown in FIG. 12A.

The example shown in FIGS. 12A and 12B is an example that used silicon as a material for the positioning frame 2, which was formed by anisotropic etching.

In FIGS. 12A and 12B, the step parts 45 have slope {111} planes 24a and 24b. On this account, they have the same tilt angle as that of the {111} plane 24 of the contactor block 1 shown in FIG. 3. Therefore, the positioning accuracy of the contactor block 1 can be enhanced.

In addition, the positioning frames 2 shown in FIGS. 11A, 11B, 12A and 12B are partially depicted for explanation. However, a plurality of contact blocks 1 is actually disposed throughout the wafer surface, and thus the frames are formed to have a size to position the plurality of contactor blocks 1.

More specifically, as shown in FIG. 13, the positioning frame 2 has the size to cover the entire surface of the wafer 3.

As described above, the invention has been described specifically according to the embodiments. However, it is needles to say that the invention is not limited to the embodiments, which can be modified variously without deviating the scope of the technical teachings.

For example, in the embodiments, the case has been described that the contactor blocks are used as the wafer full surface simultaneous contact system of divided contactor integration. However, a silicon membrane sheet can be used instead of the contactor blocks.

Additionally, when the probes of the contactor blocks are brought into contact with the wafer to be tested at a predetermined pressure, a mechanically pressing mechanism may be used, not limited to vacuuming.

Furthermore, also the cassette structure for the wafer level burn-in test is not limited to the examples described above. It may have a structure having a plurality of contactor blocks for a single wafer to be tested.

Moreover, it is needless to say that the number of contactor blocks divided for a single wafer to be tested or the number of chips for a single contactor block can be changed variously.

Besides, the example of using the double-ended beam for the beam for supporting the probes has been described in the invention. However, other beam structures, such as a cantilever, can be adapted to exert the same advantage.

In addition, in the description above, the case has been described mainly that the invention is adapted to the wafer level burn-in test for the SRAM, which is the technical field of the invention. However, it is not limited thereto, the invention can be adapted to memory LSIs such as DRAM or flash memory, or logic LSIs. The invention can be applied widely to the general wafer level burn-in tests, including semiconductor products such as products of wafer shipment and MCP.

Furthermore, the invention can be adapted to the general burn-in tests or probe tests in addition to the wafer level burn-in tests. In this case, the same advantage in the application to the wafer level burn-in tests can be obtained.

Moreover, the positioning groove was formed in the contactor block 1, but a notch part such as a hole may be formed instead of the groove. More specifically, it is acceptable that a shape of the positioning part for the positioning frame and the contactor block is a shape capable of performing positioning in the X- and Y-directions and Z-direction of the height direction. Therefore, positioning can be performed in which notch supporting parts such as cylindrical projections are formed in the positioning part, and holes inserted with the supporting part such as the projections are formed in the contactor block.

Besides, other that the cylindrical shape, polygonal projections and holes may be formed in the positioning frame and the contactor block. In addition, positioning can be performed in which grooves are formed in both the positioning frame and the contactor block and glass balls or glass bars are inserted into the grooves formed in the positioning frame and the contactor block.

According to the semiconductor device testing apparatus of the invention, a plurality of divided contactor blocks is formed with the grooves for positioning, and the grooves are used to position the plurality of contactor blocks with the positioning frame. The contactor blocks are divided into plurals. Therefore, it is less likely that a partial surface distortion influences other parts to impair surface flatness, as compared with the case where a plurality of non-divided contactors is formed in one piece, and a plurality of contactors can be uniformly brought onto contact with the wafer to be tested. In addition, even though abnormality is generated in a part of the contactor block, only the part of the contactor block is replaced by a new contactor block. Thus, replacement costs can be reduced, as compared with the case where a plurality of non-divided contactors is formed in one piece.

Accordingly, the semiconductor device testing apparatus can be realized, which allows contactors to be positioned highly accurately throughout the wafer surface for uniform contact, performing the tests for the large-sized wafer, and cost reduction.

Additionally, the method for manufacturing the semiconductor device testing apparatus can be implemented.

Furthermore, the semiconductor device excellent in mass production with low costs and high reliability can be provided.

What is claimed:

1. A semiconductor device testing apparatus comprising:
   a plurality of contactor blocks, each of which has a probe to contact electrically with an electrical pad of a semiconductor device, wherein each of said contactor blocks includes a notch; and
   positioning frame having a plurality of portions to align with said notches of said contactor blocks, to support said contactor blocks.

2. A semiconductor device testing apparatus according to claim 1, wherein said portions comprise horizontal portions respectively formed on said contactor blocks, and horizontal portions provided on said positioning frame which support said horizontal portions of the contactor blocks.

3. A semiconductor device testing apparatus according to claim 1, wherein said notches each have a horizontal portions, and said supporting portions of said positioning frame each have a horizontal portion which supports said horizontal portions of the notches.

4. A semiconductor device testing apparatus according to claim 1, wherein said portion include a pair of grooves which cross each other on each of said contactor blocks.

5. A semiconductor device treating apparatus according to claim 1, wherein each of said contactor blocks includes a first surface, and wherein said notch and said probe are both formed on said first surface on each of said contactor blocks.

6. A semiconductor device testing apparatus according to claim 1, wherein the thermal expansion coefficient of each of said contactor blocks is substantially equal to that of the semiconductor device being tested.

7. A semiconductor device testing apparatus according to claim 1, wherein each of said contactor blocks is comprised of silicon.

8. A semiconductor device testing apparatus according to claim 1, wherein the thermal expansion coefficient of said positioning frame is substantially equal to that of the semiconductor device being tested.

9. A semiconductor device testing apparatus according to claim 1, wherein said positioning frame is comprised of at least one of an alloy, nickel, glass or silicon.

10. A semiconductor device testing apparatus comprising:
    a contactor substrate having a probe for electrically contacting an electrode pad in a semiconductor device, wherein the contactor substrate has a plurality of contactor blocks, each of the contactor blocks being formed with probes formed in a beam, wiring and a positioning part, and
    a positioning frame for positioning the plurality of contactor blocks, wherein the positioning frame is formed with a supporting part for supporting the positioning part formed in the contactor block.

11. A semiconductor device testing apparatus according to claim 10, wherein each of the contactor blocks includes a notch, and wherein the positioning frame includes a plurality of portions to align with the notches of the contractor blocks.

12. A semiconductor device testing apparatus according to claim 10, wherein the positioning frame comprises horizontal portions respectively formed on the contactor blocks, and wherein horizontal portions provided on said positioning frame support the horizontal portions of the contactor blocks.

13. A semiconductor device testing apparatus according to claim 10, wherein the contactor blocks include notches having horizontal portions, and wherein the supporting portions of said positioning frame have horizontal position which support the horizontal portions of the notches.

* * * * *